United States Patent
Trier et al.

[11] Patent Number: 5,834,981
[45] Date of Patent: Nov. 10, 1998

[54] WHISPERING GALLERY MODE DIELECTRIC RESONATOR OSCILLATOR CIRCUIT

[75] Inventors: Marc Trier, Pinsaguel; Aline Bazil, Toulouse, both of France

[73] Assignee: Matra Marconi Space France, France

[21] Appl. No.: 885,669

[22] Filed: Jun. 30, 1997

[30] Foreign Application Priority Data

Jul. 3, 1996 [FR] France .................................. 96 08276

[51] Int. Cl.⁶ ...................................................... H03B 5/18
[52] U.S. Cl. ................. 331/99; 331/117 D; 331/117 FE; 333/219.1
[58] Field of Search .................... 331/96, 99, 117 FE, 331/117 D, 107 SL; 333/219.1

[56] References Cited

U.S. PATENT DOCUMENTS

| | | | |
|---|---|---|---|
| 4,713,632 | 12/1987 | Nishikawa et al. | 331/117 D |
| 4,992,763 | 2/1991 | Bert et al. | 333/219.1 |
| 5,652,556 | 7/1997 | Flory et al. | 331/107 D |

OTHER PUBLICATIONS

Gross et al, "Design of Series Feedback Millimeter Wave Oscillators employing Whispering Gallery Mode Dielectric Resonators", 22nd European Microwave Conference, vol. 1, Aug. 24–27, 1992, Helsinki, Finland, pp. 491–496.

Bermudez et al, "A 94 GHz Low Noise GaAs FET Oscillator using Whispering–Gallery Dielectric Resonator Modes And a New Push–Push Configuration Reducing 1/f Converted Noise", 1988 IEEE MTT International Microwave Symposium Digest, vol. 1, May 25–27, 1988, New York, pp. 481–484.

Patent Abstracts of Japan, vol. 11, No. 314 (E–549) Patent No. 62107502, May 18, 1987.

*Primary Examiner*—Siegfried H. Grimm
*Attorney, Agent, or Firm*—Gary M. Nath; Nath & Associates

[57] ABSTRACT

A microwave source has an amplifying transistor capable of operating at microwave frequencies and a frequency selection circuit. The circuit has a whispering mode dielectric resonator and a feedback loop having a first microstrip line connected by an impedance adaptation circuit to a gate of said transistor and a second microstrip line connected by an impedance adaptation circuit to a drain of said transistor. The dielectric resonator is located between the first line and the second line for magnetic field coupling therewith.

8 Claims, 1 Drawing Sheet

WHISPERING GALLERY MODE DIELECTRIC RESONATOR OSCILLATOR CIRCUIT

BACKGROUND OF THE INVENTION

The present invention relates to microwave sources for providing an output signal with high spectral purity at a frequency exceeding 10 GHz, of the type comprising an amplifying transistor capable of operating at microwave frequencies or with millimeter wavelengths, and a frequency selection circuit having a dielectric resonator coupling the input of the transistor to its output, and using a configuration commonly referred to as a "parallel feedback oscillator", which has the advantage of high stability.

Such sources can be applied in numerous fields, and in particular for providing the heterodyning frequency to a mixer in a receiver or transmitter circuit; as an example of an application, mention can be made of systems for detecting atmospheric components from satellites.

In numerous applications, and in particular on satellites, a source must be small in size and must consume little power, while providing an output frequency that is stable and of high purity. In addition, space applications require a high level of reliability and a long lifetime.

For this purpose, use has been made in particular of Gunn diode oscillators, which suffer from the drawback of dissipating a large amount of energy and of being relatively unreliable. Proposals have also been made to use oscillators of the type defined above comprising a T-mode dielectric resonator having the advantage of consuming less energy and of having high stability. However, for microwaves, such resonators are of very small diameter, e.g. 2 millimeters at 24 GHz, and they have a low Q-factor.

SUMMARY OF THE INVENTION

An object of the invention is to provide a microwave source of the above-defined type that satisfies practical requirements better than previously known sources. To this end, there is provided a source in which the dielectric resonator is of the type that operates in whispering gallery mode and is magnetically coupled with microstrip lines to constitute a feed back loop. The use of a transistor associated with a resonator also has the advantage of high efficiency (ratio of output power over power consumption) and of low dissipated power.

The resonance modes suitable for such operation are essentially the $E_{n,0,0}$ and the $H_{n,0,0}$ modes where n is the azimuth order corresponding to the aspect of the field. It is generally preferable to use $E_{n,0,0}$ mode, also referred to as $WGE_{n,0,0}$, since it has the advantage of a magnetic field that is more confined and it has a better Q-factor. An essential advantage of that resonance mode is that it corresponds to a diameter that is greater, and thus to manufacture that is easier, compared with TE 01 δ mode at the same frequency. The radial confinement of energy at the periphery of the resonator defining an inactive central zone or "caustic", gives rise to a higher Q-factor.

The dielectric resonator may be coupled to the circuits by the magnetic field which has a distribution that is compatible with microstrip lines.

In the absence of a load, the Q-factor increases with azimuth order n. However coupling to lines is more difficult because electromagnetic confinement increases with azimuth order.

A satisfactory compromise can often be found for a value of n lying in the range 5 to 10, which corresponds, for example, to a dielectric resonator having a diameter of about 10 mm for the 24 GHz band.

Another advantage of whispering gallery mode is the fact that the height of the resonator can be smaller, thereby making it easier to integrate. For a given frequency, a plurality of heights corresponding to different values of n are possible. Frequency fine-tuning can be performed by means of an adjustable metal disk above the resonator, but at the price of increasing vertical size.

For a frequency range of 1 GHz to 90 GHz, the transistor of the oscillator is generally a gallium arsenide metal semiconductor field-effect transistor (MESFET) or an AlGaAs high electron mobility transistor (HEMT). Which one is selected depends on which parameters are to be favored. Depending on frequency, either a MESFET or an HEMT is preferable when looking for large output power. A HEMT is also preferable when looking for very low noise level.

The above features and others will appear from the following description of particular embodiments, given by way of examples.

DETAILED DESCRIPTION

Figure 1:
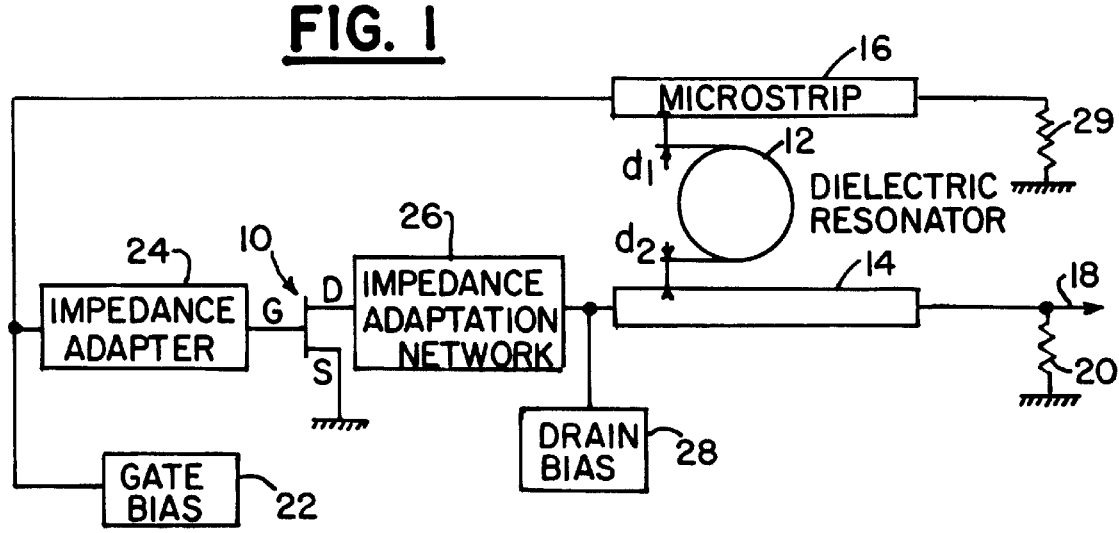
FIG. 1 is a block diagram of an oscillator constituting a particular embodiment of the invention.

The oscillator shown diagrammatically in FIG. 1 comprises an amplifying field-effect transistor 10 in a common source configuration together with a dielectric resonator 12 coupled simultaneously to two microstrip lines 14 and 16 belonging to matching circuits. The microwave output of the oscillator is connected to ground via a load resistor 20. A gate bias circuit 22 is connected to the gate G of the transistor 10 via an impedance matching circuit 24. The drain D of the transistor 10 is coupled to the resonator 12 via an output impedance matching circuit comprising a network 26 and the line 14. A drain bias circuit 28 is connected thereto, via the network 26, while the source S of the transistor is grounded, which is favorable for the thermal behavior of the oscillator, and thus makes it possible to achieve higher output power for a given transistor and given reliability.

It can be seen that the dielectric resonator 12 is coupled simultaneously to both lines 14 and 16, thus constituting a parallel feedback oscillator. The parallel feedback structure of the drain D to the gate G is made possible because of the two-line coupling and because of the travel direction in the resonator that are specific to whispering gallery mode. A comparable result could not be achieved with a resonator using a mode of the TE 01 δ type, where the resistor 29 would be replaced by an open circuit for keeping the waves stationary, thus giving rise to a risk of undesirable oscillation at other frequencies.

Figure 2:
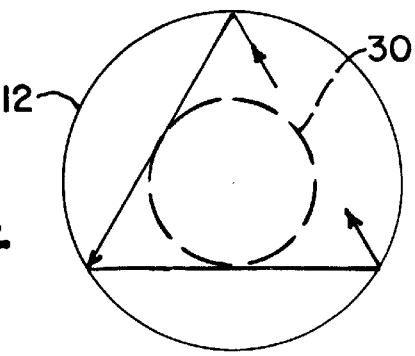
FIG. 2 is a diagram for showing the existence of a caustic in whispering gallery modes.

The principle on which a whispering gallery mode oscillator operates is shown in FIG. 2 in optical form, for the special case of n=3. Energy is confined in a radial direction to lie outside a cylindrical zone that is itself defined by a circle 30 generally known as a "caustic". The radius of the circle increases or decreases depending on the azimuth number n of the resonance. Energy is also confined in the axial direction. This confinement makes it possible to obtain high Q-factors, because the amount of energy radiated is lower.

Figure 3:
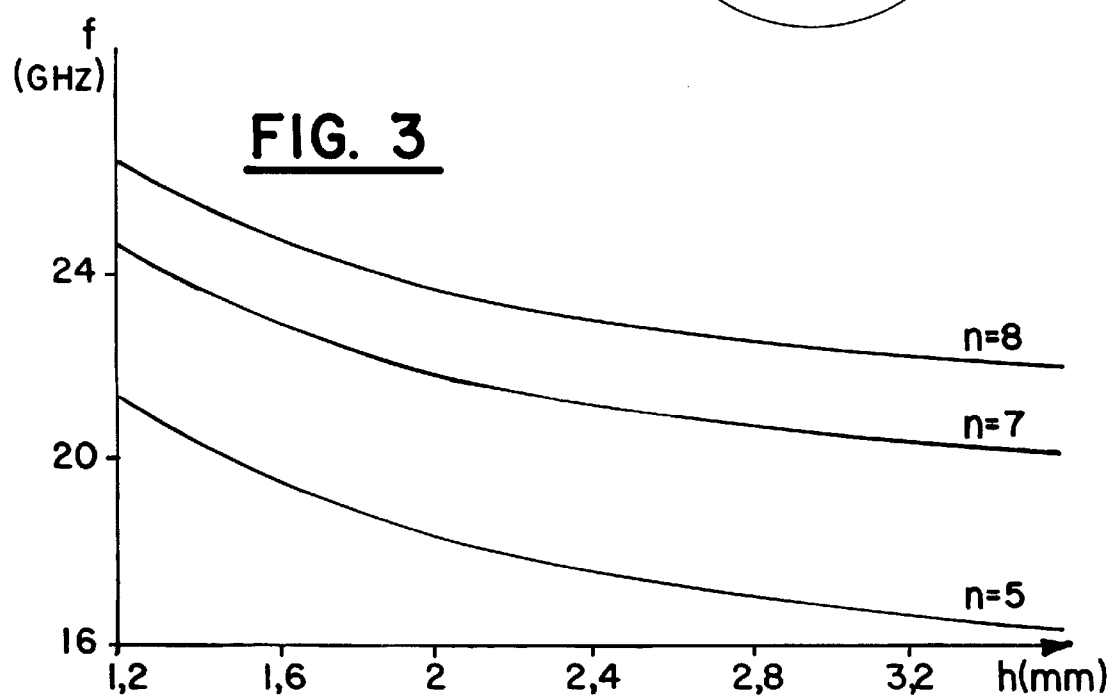
FIG. 3 is a graph showing how resonance frequency varies as a function of the height of a cavity operating in whispering gallery mode for several orders and in electric mode.

As mentioned above, it is possible to select the azimuth order n by adjusting the height of the resonator. FIG. 3 is a graph showing how resonance frequency varies as a function of height, for various values of n, and for the particular case of a resonator having a radius of 5 mm and a dielectric constant of 30.

By way of example, the following characteristics can be given which apply to an oscillator operating at a frequency of 19.625 GHz and delivering an output power of 17 dBm. The resonator is made of a material having a dielectric constant $\epsilon=30$, and a height of 1.62 mm, for n=5. The oscillator was mounted on an alumina substrate. The bias voltages lay in the range −1 V to −2 V between the gate and the source, and less than 7 V between the source and the drain. The microstrip lines had a characteristic impedance of 50 Ω and they were terminated on 50 Ω resistances. All of the components (transistor, thin film resistors, microstrip lines, and resonators) were mounted flat on the alumina substrate.

More generally, the use of a whispering gallery mode resonator constituted by a thin cylinder of dielectric material makes it possible to provide an oscillator that is itself thin. The resonator behaves like a directional coupler whose coupling coefficient with the feedback loop is adjustable by an appropriate selection of the distances $d_1$ and $d_2$. By an appropriate selection of dielectric to constitute the resonator, it is possible to look for the best possible compromise between the Q-factor and the dielectric constant. Finally, the oscillator can be followed by a frequency multiplier to achieve waves that are millimetric or even submillimetric.

In an embodiment that facilitates oscillator adjustments, the lines 14 and 16 are not parallel, but are at a small angle, not exceeding 100. Under such circumstances, the source can be adjusted by applying the following sequence.

In a first step, amplification is adjusted by seeking gain that is sufficient at the required operating frequency. For this purpose, the resonator 12 is removed and amplifier coupling is adjusted, by comparing an input on line 16 with an output on line 14.

In a second step, the source is adjusted by displacing the resonator longitudinally relative to the lines 14 and 16, thereby modifying feedback phase, and the coupling amplitudes are adjusted by displacement in a direction orthogonal to the lines, so as to modify $d_1$ and $d_2$. The advantage of a small amount of divergence between the lines is to provide an additional degree of freedom for adjustment purposes.

We claim:

1. A microwave source comprising:
    an amplifying transistor capable of operating at microwave frequencies; and
    a frequency selection circuit having a whispering mode dielectric resonator and a feedback loop having a first microstrip line connected by an impedance adaptation circuit to a gate of said transistor and a second microstrip line connected by an impedance adaptation circuit to a drain of said transistor, said dielectric resonator being located between the first line and the second line for magnetic field coupling with said first line and said second line.

2. Source according to claim 1, wherein said resonator is dimensioned to operate with an azimuth order lying in the range 5 to 10.

3. Source according to claim 1, wherein said amplifying transistor is a gallium arsenide MESFET transistor.

4. Source according to claim 1, wherein said amplifying transistor is an AlGaAs HEMT transistor.

5. Source according to claim 1, wherein the source of said transistor is directly grounded and ends of the microstrip lines which are opposite to ends connected to said transistor are grounded through respective load resistors, one of said second ends constituting a microwave output of said microwave source.

6. Source according to claim 5, wherein said two lines are at an angle of from 0° to 10°.

7. Source according to claim 4, wherein said resonator has a position manually adjustable in directions substantially parallel to said lines and perpendicular to said lines.

8. A method for adjusting a microwave source comprising:
    an amplifying transistor capable of operating at microwave frequencies; and
    a frequency selection circuit having a whispering mode dielectric resonator and a feedback loop having a first microstrip line connected by an impedance adaptation circuit to a gate of said transistor and a second microstrip line connected by an impedance adaptation circuit to a drain of said transistor, said dielectric resonator being located between the first line and the second line for magnetic field coupling with said first line and said second line,
    wherein said method includes the steps of:
        adjusting a gain of said source by adjusting a degree of coupling of said amplifying transistor without said resonator,
        inserting said resonator, and
        adjusting a position of the resonator with respect to said lines until selected values of a feedback phase and of a degree of magnetic coupling have been obtained.

* * * * *